(12) United States Patent
Meng et al.

(10) Patent No.: US 10,403,732 B2
(45) Date of Patent: Sep. 3, 2019

(54) SEMICONDUCTOR DEVICE INCLUDING STRIPE STRUCTURES

(71) Applicant: Semiconductor Manufacturing International (Shanghai) Corporation, Shanghai (CN)

(72) Inventors: Xiaoying Meng, Shanghai (CN); Qiuhua Han, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/055,661

(22) Filed: Feb. 29, 2016

(65) Prior Publication Data

US 2016/0254359 A1   Sep. 1, 2016

Related U.S. Application Data

(62) Division of application No. 14/295,649, filed on Jun. 4, 2014, now Pat. No. 9,312,355.

(30) Foreign Application Priority Data

Jun. 9, 2013 (CN) .......................... 2013 1 0232124

(51) Int. Cl.
*H01L 21/02* (2006.01)
*H01L 21/027* (2006.01)
(Continued)

(52) U.S. Cl.
CPC ...... *H01L 29/4238* (2013.01); *H01L 21/0273* (2013.01); *H01L 21/02115* (2013.01);
(Continued)

(58) Field of Classification Search
CPC . H01L 21/265; H01L 21/22; H01L 21/02491; H01L 21/28; H01L 21/30655;
(Continued)

(56) References Cited

U.S. PATENT DOCUMENTS 6,664,191 B1 * 12/2003 Kim .................... H01L 21/0337
257/E21.038
7,071,085 B1 * 7/2006 Lukanc ............... H01L 21/0337
257/E21.038
(Continued)

*Primary Examiner* — Natalia A Gondarenko
(74) *Attorney, Agent, or Firm* — Anova Law Group, PLLC

(57) ABSTRACT

A method is provided for fabricating stripe structures. The method includes providing a substrate; and forming a to-be-etched layer on the substrate. The method also includes forming a hard mask pattern having a first stripe on the to-be-etched layer; and forming a photoresist pattern having a stripe opening on the to-be-etched layer and the hard mask pattern having the first stripe. Further, the method includes forming a polymer layer on a top surface and side surfaces of the photoresist pattern to reduce a width of the stripe opening; forming hard mask patterns having a second stripe by etching the hard mask pattern having the first stripe using the photoresist pattern having the polymer layer as an etching mask; and forming the stripe structures by etching the to-be-etching layer using the hard mask pattern having the second stripe as an etching mask until the substrate is exposed.

12 Claims, 9 Drawing Sheets

(51) Int. Cl.
| | |
|---|---|
| *H01L 21/033* | (2006.01) |
| *H01L 21/3105* | (2006.01) |
| *H01L 21/311* | (2006.01) |
| *H01L 21/3213* | (2006.01) |
| *H01L 21/768* | (2006.01) |
| *H01L 21/8234* | (2006.01) |
| *H01L 29/06* | (2006.01) |
| *H01L 29/423* | (2006.01) |
| *H01L 23/528* | (2006.01) |
| *H01L 27/088* | (2006.01) |
| *H01L 29/49* | (2006.01) |
| *H01L 21/28* | (2006.01) |
| *H01L 49/02* | (2006.01) |

(52) U.S. Cl.
CPC .... *H01L 21/02274* (2013.01); *H01L 21/0337* (2013.01); *H01L 21/28114* (2013.01); *H01L 21/28123* (2013.01); *H01L 21/31058* (2013.01); *H01L 21/31138* (2013.01); *H01L 21/31144* (2013.01); *H01L 21/32139* (2013.01); *H01L 21/76892* (2013.01); *H01L 21/823437* (2013.01); *H01L 21/823475* (2013.01); *H01L 23/5283* (2013.01); *H01L 27/088* (2013.01); *H01L 28/20* (2013.01); *H01L 29/0649* (2013.01); *H01L 29/4916* (2013.01)

(58) Field of Classification Search
CPC ......... H01L 21/76205; H01L 21/31144; H01L 21/3065; H01L 21/3081; H01L 21/31056; H01L 21/7681; H01L 21/76811; H01L 21/02436; H01L 21/469; H01L 21/4763; H01L 21/0212; H01L 21/31058; H01L 21/31127; H01L 21/312; H01L 21/02126; H01L 21/0214; H01L 21/823828; H01L 21/823842; H01L 21/823871; H01L 21/76224; H01L 21/76283; H01L 21/76227; H01L 21/76235; H01L 21/76237; H01L 21/76; H01L 21/823878; H01L 33/20; H01L 33/02; H01L 33/0083; H01L 33/0054; H01L 21/47573; H01L 21/02107; H01L 21/82385; H01L 21/02365; H01L 21/20; H01L 21/31; H01L 23/48; H01L 23/528; H01L 23/5352; H01L 29/78645; H01L 29/8124; H01L 29/66553; H01L 29/0649; H01L 29/4916; H01L 21/28114; H01L 21/76892; H01L 21/823475; H01L 21/28123; H01L 21/32136; H01L 21/32139; H01L 21/31138; H01L 21/0337; H01L 21/0273; H01L 21/02274; H01L 21/02115; H01L 21/76805; H01L 21/823437; H01L 23/535; H01L 27/088; H01L 27/10885; H01L 27/10888; H01L 27/0629; H01L 27/3276; H01L 28/20; H01L 21/76802; H01L 21/76826; H01L 21/76897; H01L 21/76877; H01L 21/76895; H01L 21/3086; H01L 21/76843; H01L 21/2813; H01L 21/308; H01L 21/76834; H01L 21/7684; H01L 21/027; H01L 21/0274; H01L 21/0338; H01L 21/0465; H01L 21/743; H01L 23/5283; H01L 29/4616
USPC ..... 438/9, 42, 157, 176, 221, 233, 296, 478, 438/533, 553, 584, 674, 679, 680, 695, 438/696, 700, 706, 725, 736, 738, 257, 438/266, 382, 618, 585; 257/506, 315, 257/316
See application file for complete search history.

(56) References Cited

U.S. PATENT DOCUMENTS

| | | | | |
|---|---|---|---|---|
| 2002/0119612 | A1* | 8/2002 | Ohuchi | H01L 21/0271 438/200 |
| 2003/0235789 | A1* | 12/2003 | Chang | G03F 7/0035 430/312 |
| 2005/0233487 | A1 | 10/2005 | Liu et al. | |
| 2006/0154477 | A1* | 7/2006 | Geng | H01L 21/0337 438/637 |
| 2007/0235797 | A1* | 10/2007 | Lojek | H01L 27/115 257/315 |
| 2008/0044989 | A1* | 2/2008 | Oh | G03F 1/70 438/585 |
| 2009/0035944 | A1 | 2/2009 | Chiang et al. | |
| 2010/0176479 | A1* | 7/2010 | Postnikov | G03F 7/40 257/499 |
| 2010/0224587 | A1 | 9/2010 | Mukawa | |
| 2010/0285669 | A1 | 11/2010 | Shima et al. | |
| 2012/0049286 | A1* | 3/2012 | Beyer | H01L 21/0337 257/368 |
| 2013/0154004 | A1* | 6/2013 | Liu | H01L 29/66795 257/347 |
| 2013/0288482 | A1 | 10/2013 | Nam et al. | |

* cited by examiner

SEMICONDUCTOR DEVICE INCLUDING STRIPE STRUCTURES

CROSS-REFERENCES TO RELATED APPLICATIONS

This application is a divisional of U.S. patent application Ser. No. 14/295,649, filed on Jun. 4, 2014, which claims the priority of Chinese patent application No. 201310232124.8, filed on Jun. 9, 2013, the entirety of all of which is incorporated herein by reference.

FIELD OF THE INVENTION

The present invention generally relates to the field of semiconductor technology and, more particularly, relates to stripe structures and fabrication techniques thereof.

BACKGROUND

With the rapid development of the ultra large scale integration (ULSI), the manufacturing process of integrated circuits (ICs) has become more and more complex and precise. Thus, stripe structures, such as poly silicon gates, and interconnect metal lines, etc., have become thinner and thinner; and the distance between stripe structures have become smaller and smaller as well. Therefore, it has become more and more difficult to form stripe structures which match the desired technology requirements using dry etching processes.

A process for forming stripe structures normally includes forming a patterned photoresist layer with stripe patterns by exposing a photoresist layer using a photomask having the stripe patterns; and followed by etching the to-be-etched layer by a dry etching process using the patterned photoresist layer as an etching mask. During the dry etching process, because the corner angles of the stripe structures are relatively thin; and they may be overly etched, the corner angles are easy to turn into arcs. In order to overcome the overly etching issues, a double-patterning method using double-lithography and double-etching has been developed.

FIGS. 1~3 illustrate the method using the double-lithography and double-etching scheme. FIG. 1 illustrates a mask for the first lithography; FIG. 2 illustrates a mask for the second lithography; and the FIG. 3 illustrates the stripe structures formed by the method.

Specifically, a photoresist layer is formed on the to-be-etched layer firstly; and then the first lithography process is performed to expose and develop the photoresist layer using the mask illustrated in FIG. 1. Then, a first etching process is performed onto the to-be-etched layer using the patterned photoresist layer as an etching mask. After the first etching process, a second photoresist layer is formed on the to-be-etched layer which has been etched by the first etching process; and performing the second photolithography process to expose and develop the second photoresist layer using the mask illustrated in FIG. 2. Then, the to-be-etched layer etched by the first etching process is etched by a second etching process one more time; and stripe structures illustrated in FIG. 3 are formed. Because the stripe structures are formed by two etching processes, the shape of the corner angles of the formed stripe structures may match the desired requirements.

However, with continuously decreasing the critical dimension of the semiconductor processes, a distance between the end points of a stripe structure 1 and a stripe structure 2 which are in a same line is correspondingly shrunk. Thus, the difficulties for photolithography processes are increased; and the morphology of the sidewalls at ends of the stripe structure 1 and the stripe structure 2 may not match the desired requirements. The disclosed device structures and methods are directed to solve one or more problems set forth above and other problems.

BRIEF SUMMARY OF THE DISCLOSURE

One aspect of the present disclosure includes a method for fabricating stripe structures. The method includes providing a substrate; and forming a to-be-etched layer on the substrate. The method also includes forming a hard mask pattern having a first stripe on the to-be-etched layer; and forming a photoresist pattern having a stripe opening on the to-be-etched layer and the hard mask pattern having the first stripe. Further, the method includes forming a polymer layer on a top surface and side surfaces of the photoresist pattern to reduce a width of the stripe opening; forming hard mask patterns having a second stripe by etching the hard mask pattern having the first stripe using the photoresist pattern having the polymer layer as an etching mask; and forming stripe structures by etching the to-be-etched layer using the hard mask pattern having the second stripe as an etching mask until the substrate is exposed.

Another aspect of the present disclosure includes a semiconductor structure having stripe structures. The semiconductor structure having stripe structures includes a substrate; and a plurality of isolation structures formed in a surface of the substrate. The semiconductor structure having stripe structures also includes a plurality active regions isolated by the isolation structures formed on the surface of the substrate; and a plurality of the stripe structures formed on top surfaces of the isolation structures and active regions.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
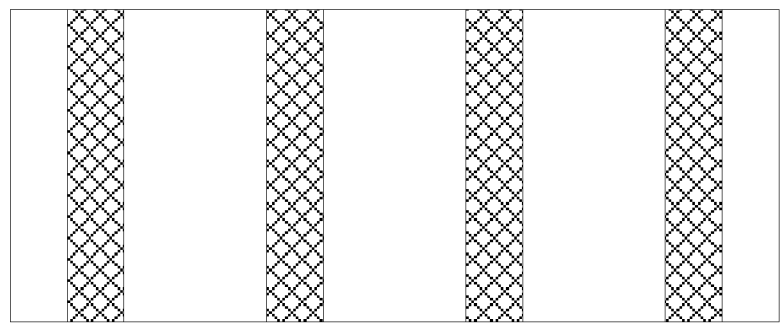
FIGS. 1~2 illustrate existing photo masks for forming stripe structures.
Figure 2:
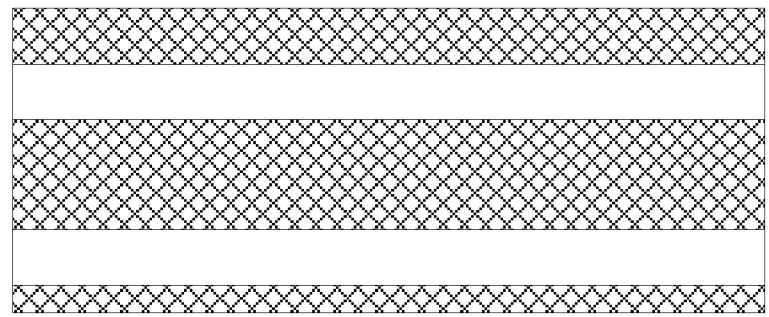
Figure 3:
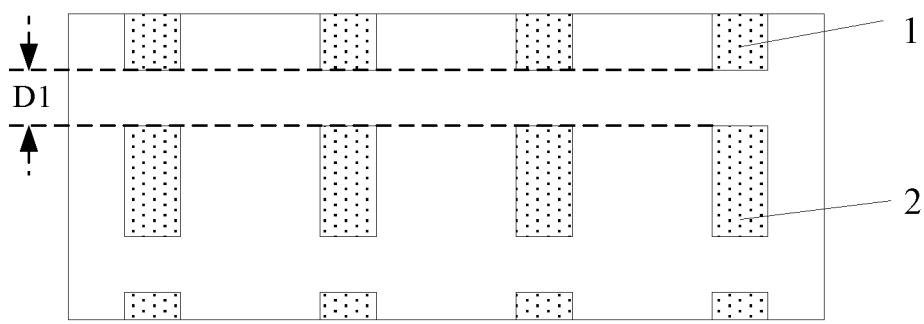
FIGS. 3~5 illustrate existing stripe structures.

Referring to FIG. 3, because the distance D1 between the ends of the first stripe structure 1 and the second stripe structure 2 becomes smaller and smaller, the photolithography processes become more and more difficult. Further, with continuously shrinking the critical dimension, only the photoresist with smaller hardness and thickness may be used as the second photoresist layer. However, when the photoresist with smaller hardness and thickness is used for exposure and development, the morphology of side surfaces of the patterned second photoresist layer may not match the desired requirements. The poor morphology of the patterned second photoresist layer may cause the side surfaces the ends of the first stripe structure 1 and the second stripe structure 2 at a same line to have unacceptable morphology as well, thus it may be easy to cause the first stripe structure 1 and the second stripe structure 2 to connect together, i.e., bridge effect; and to have a short circuit.

Figure 4:
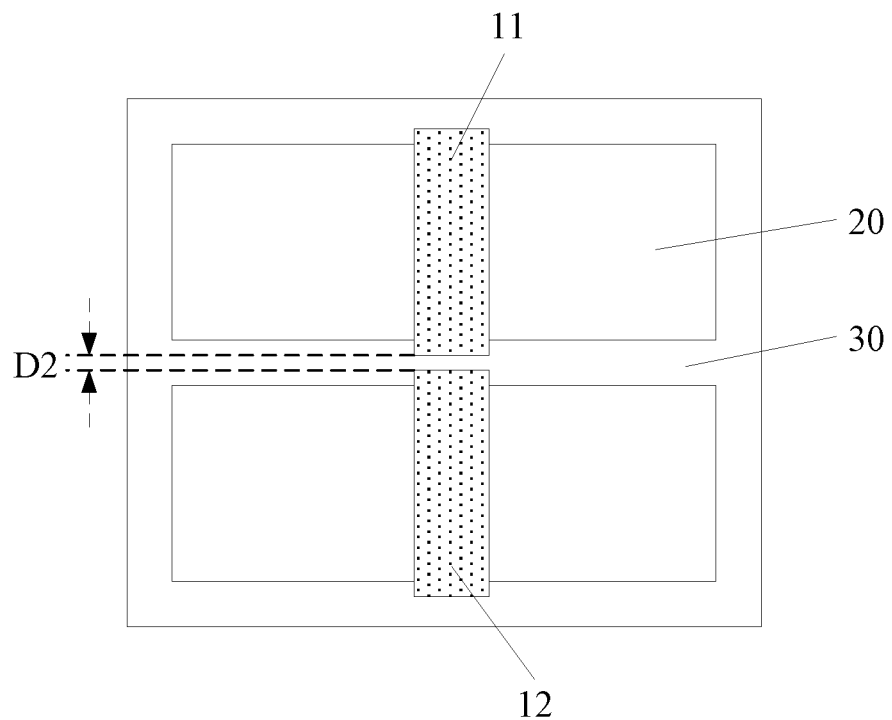

Further, as shown in FIG. 4, when the stripe structures are poly silicon gates, the first poly silicon gate 11 and the second poly silicon gate 12 may need to span over the active region 20; and the two ends of the first poly silicon 11 and/or the two ends of the second poly silicon gate 12 may be on the surface of the shallow trench isolation structure 30. However, the width of the shallow trench isolation structure 30 may be substantially small, for example, may be the critical dimension, thus the distance $D_2$ between one end of the first poly silicon gate 11 and the second silicon gate 12 at the same line may be even smaller; and it may be difficult to form the opening between the first poly silicon gate 11 and the second poly silicon gate 12 by an existing photolithography process.

Figure 5:
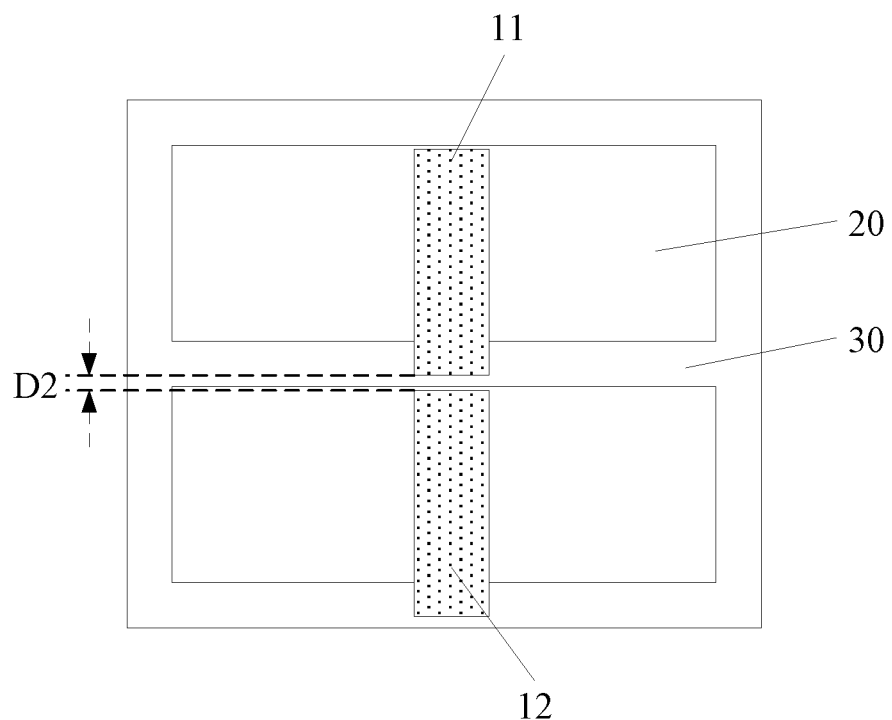

Further, because the contact region between the first poly silicon gate 11 and the shallow trench isolation structure 30 and the contact region between the second poly silicon gate 12 and the shallow trench isolation structure 30 may be substantially small as well, once an overlay shift of the photolithography process occurs, position errors of the first poly silicon gate 11, the second poly silicon gate 12 and the active region 20 may occur too. As shown in FIG. 5, such position errors may cause the first poly silicon gate 11 and/or the second poly silicon gate 12 not to connect with the shallow trench isolation structure 30; and the MOS transistor may fail. Therefore, it may be difficult to form poly silicon gates with an acceptable quality. According to the disclosed device structures and methods, the position errors and other issues may be overcome by forming a polymer layer on the top surface and the side surfaces of the stripe openings of the second patterned photoresist layer.

Figure 15:
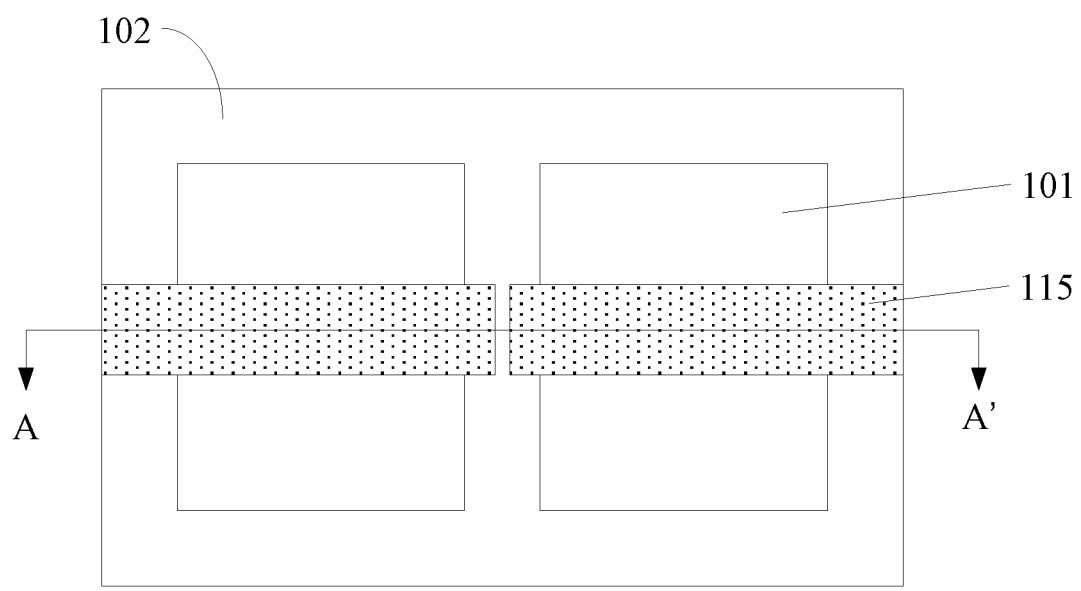
Figure 16:
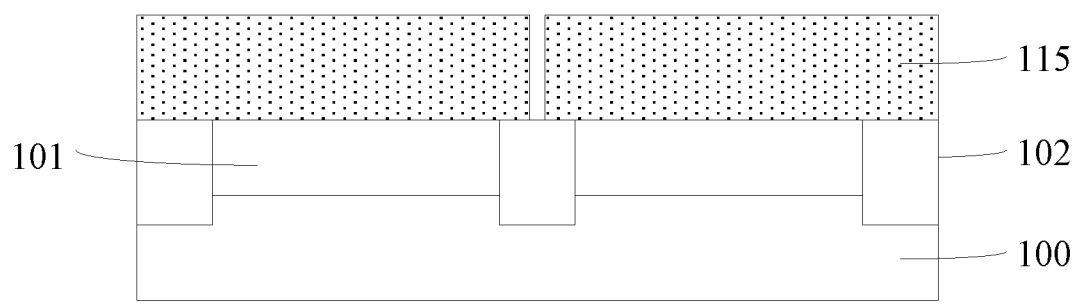
Figure 17:
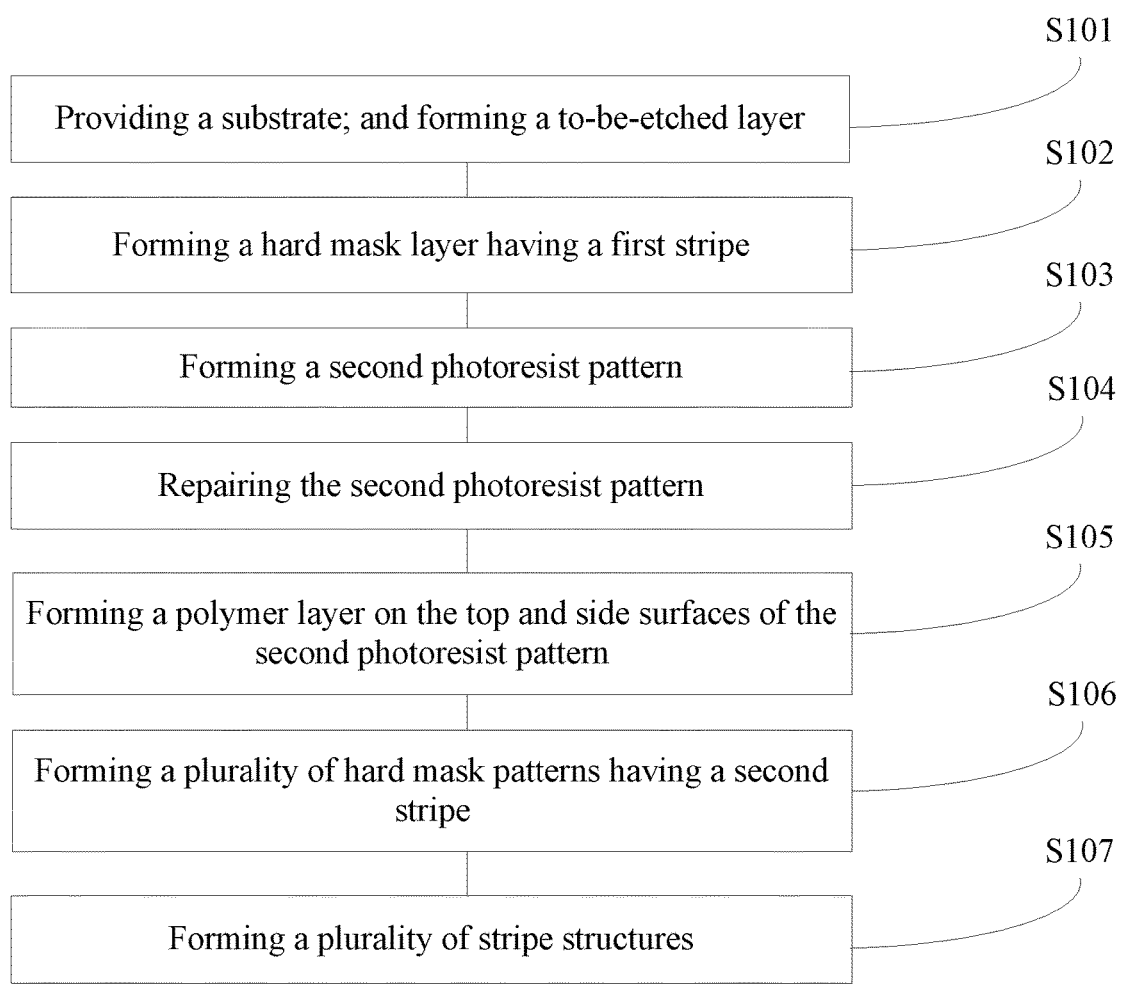
FIG. 17 illustrates an exemplary fabrication process of stripe structures consistent with the disclosed embodiments.

FIG. 17 illustrates an exemplary fabrication process of a semiconductor structure with stripe structures consistent with disclosed embodiments; and FIGS. 6~16 illustrate semiconductor structures corresponding to certain stages of the exemplary fabrication process.

Figure 6:
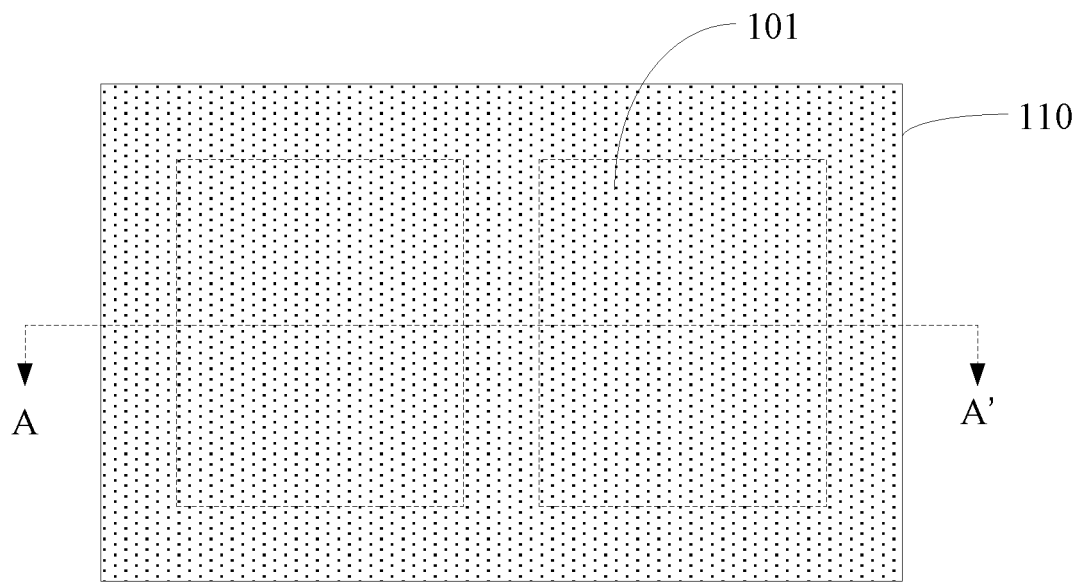
FIGS. 6~16 illustrate semiconductor structures corresponding to certain stages of an exemplary fabrication process of stripe structures consistent with the disclosed embodiments.
Figure 7:
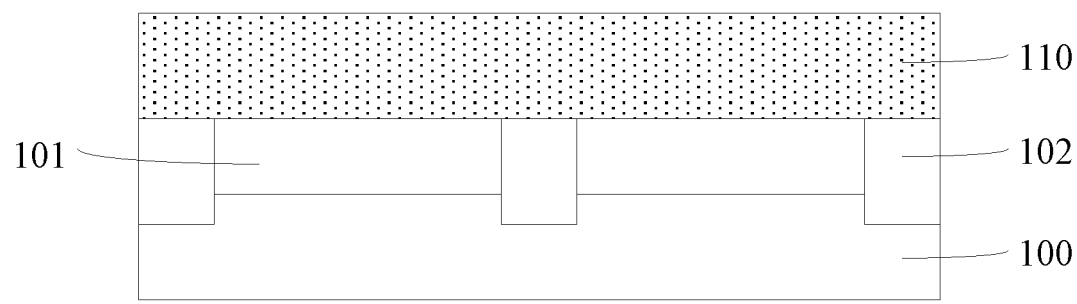

As shown in FIG. 17, at the beginning of the fabrication process, a substrate with certain structures is provided (S101). FIGS. 6~7 illustrate a corresponding semiconductor structure; and FIG. 7 is a cross-section view of the semiconductor structure illustrated in FIG. 6.

As shown in FIGS. 6~7, a substrate 100 is provided. A to-be etched layer 110 is formed on one surface of the substrate 100. Further, active regions 101 are formed in the surface of the substrate 100; and shallow trench isolation structures 102 electrically isolating the active regions 101 are also formed in the surface of the substrate 100.

The substrate 100 may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenidie, gallium antimonite, or alloy semiconductor, etc. The substrate 100 may also be a multiple-layered substrate, for example, a substrate covered with dielectric layers and/or metal layers. In one embodiment, the substrate 100 is made of silicon. The substrate 100 provides a base for subsequent processes and structures.

The active regions 101 and shallow trench isolation structures 102 may be formed by any appropriate process. Stripe poly silicon gates may be subsequently formed to span over the active regions 101 and contact on the isolation structures.

The to-be-etched layer 110 may be made of any appropriate material, such as poly silicon, dielectric material including silicon oxide, or silicon nitride, etc., or metal layer for forming interconnect lines, metal gates, or resistors, etc. The to-be-etched layer 110 may also be a multiple-stacked layer made of dielectric layers and metal layers. In one embodiment, the to-be-etched layer 110 is a multiple-stacked layer including a gate oxide layer and a poly silicon layer. Thus, the subsequently formed stripe structures may be poly silicon gates.

Various processes may be used to form the to-be-etched layer 110, such as a chemical vapor deposition (CVD) process, a physical vapor deposition (PVD) process, an atomic layer deposition (ALD) process, a flowable chemical vapor deposition (FCVD) process, a thermal oxidation process, or a sputtering process, etc.

Figure 8:
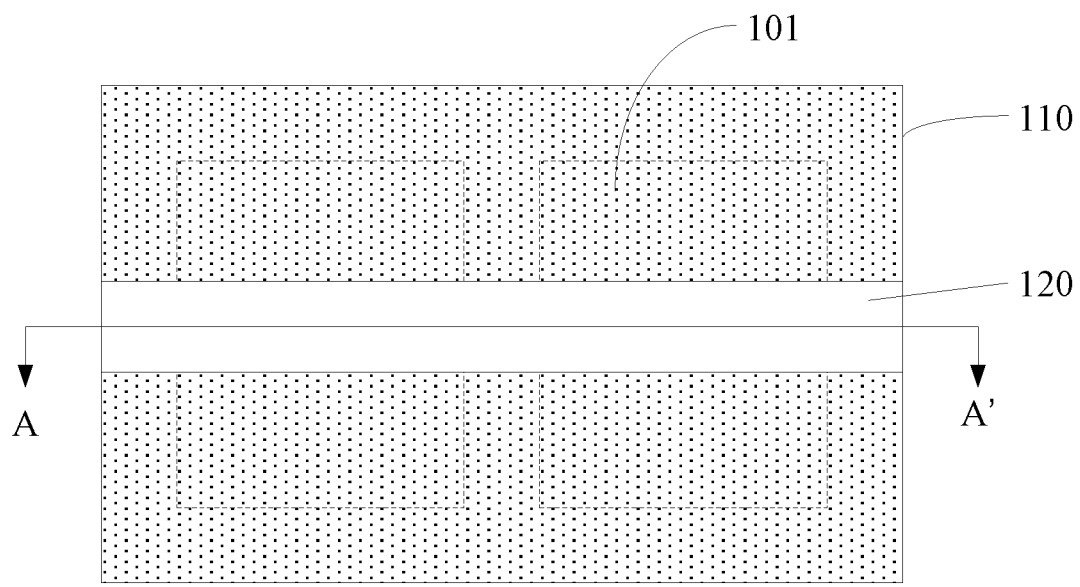
Figure 9:
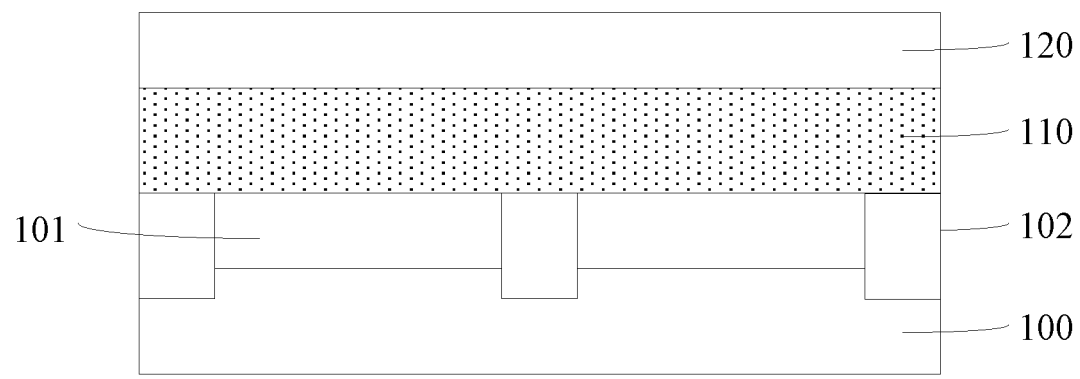

Returning to FIG. 17, after providing the substrate 100 and forming the to-be-etched layer 110, a hard mask pattern having a first stripe may be formed (S102). FIGS. 8~9 illustrate a corresponding semiconductor structure; and FIG. 9 is a cross-section view of the semiconductor structure illustrated in FIG. 8 along the AA' direction.

As shown in FIGS. 8~9, a hard mask pattern 120 having a first stripe (not labeled) is formed on the surface of the to-be-etched layer 110. A process for forming the hard mask pattern 120 having the first stripe may include sequentially forming a hard mask material layer (not shown) on the surface of the to-be-etched layer 110; forming a first photoresist pattern (not shown) on the hard mask material layer; and etching the first hard mask material layer using the first photoresist pattern as an etching mask until the surface of the to-be-etched layer 110 is exposed. Thus, the hard mask pattern 120 having the first stripe may be formed. The number of the first stripe of the hard mask pattern 120 may be one or more. For illustrative purposes, one stripe is used in the description.

The hard mask pattern 120 (or the hard mask material layer) having the first stripe may be made of any appropriate material, such as silicon oxide, silicon nitride, silicon oxynitride, or metal, etc. The hard mask material layer may also be a multiple-stacked layer made of two or more materials. In one embodiment, the hard mask layer is made of silicon nitride. That is, referring to FIGS. 8~9, the stripe of the hard pattern 120 is one or more rectangular silicon nitride layers.

Various processes may be used to form the hard mask layer, such as CVD process, a PVD process, an ALD process, an FCVD process, or a sputtering process, etc.

Figure 10:
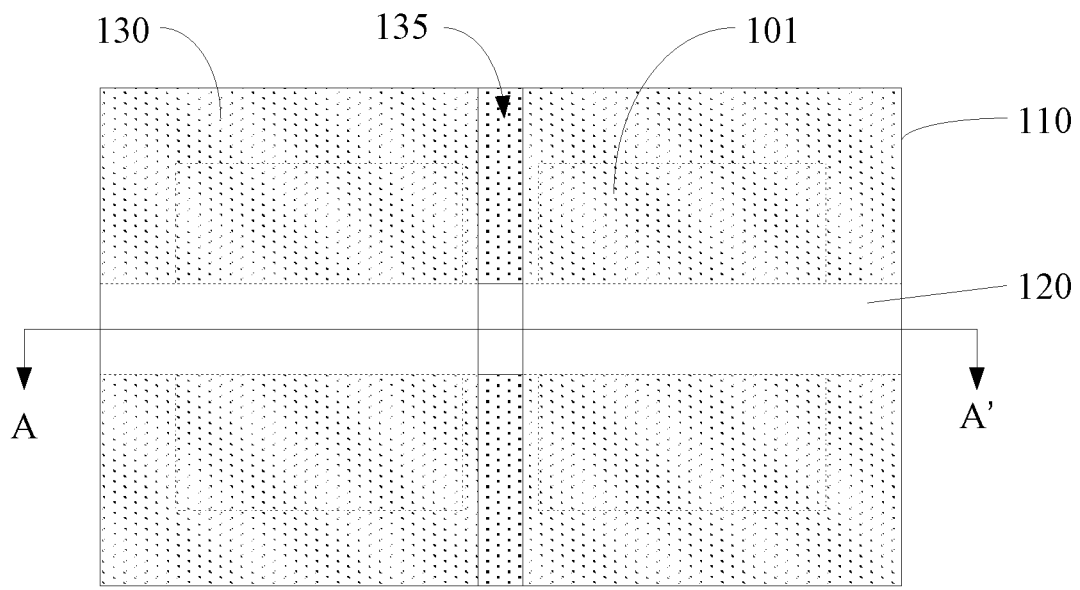
Figure 11:
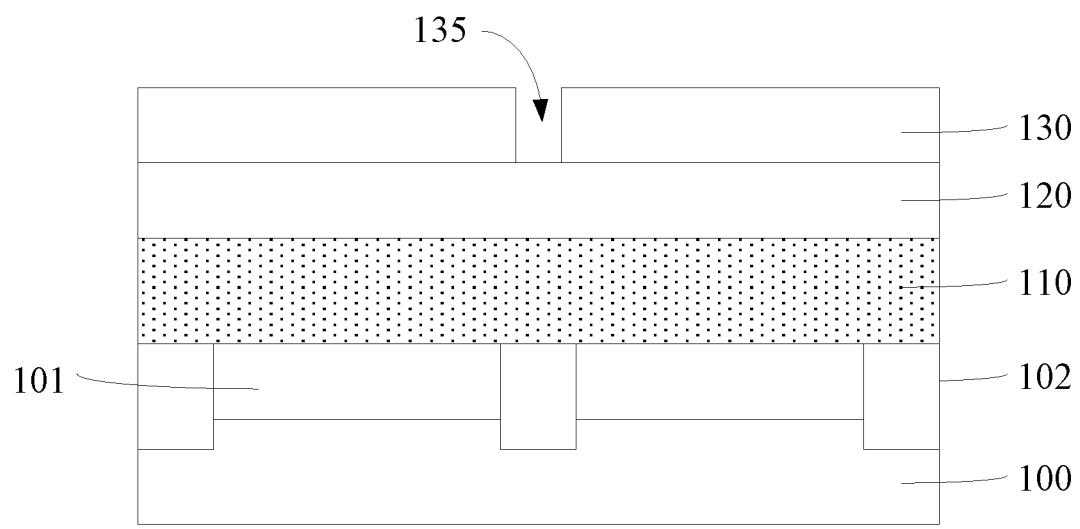

Returning to FIG. 17, after forming the hard mask pattern 120 having the first stripe, a second photoresist pattern may be formed (S103). FIGS. 10~11 illustrate a corresponding semiconductor structure and FIG. 11 is a cross-section view of the semiconductor structure illustrated in FIG. 10 along the AA' direction.

As shown in FIGS. 10~11, a second photoresist pattern 130 is formed on the surfaces of the to-be-etch layer 110 and the hard mask pattern 120 having the first stripe. The second photoresist pattern 130 may have a stripe opening 135. In certain other embodiments, the second photoresist pattern 130 may have two or more stripe openings 135. Further, the stripe opening 135 may have a pre-determined angle with the hard mask pattern 120 having the first stripe. In one embodiment, the long side of the stripe opening 135 may perpendicular to the long side of the hard mask pattern 120 having the first stripe. Further, the stripe opening 135 may expose a portion of the hard mask pattern 120 having the first stripe.

In one embodiment, a polymer layer may be subsequently formed on the top surface and the side surfaces of the second photoresist pattern 130 to make the stripe opening 135 narrower, the width of the stripe opening 135 may be smaller than a distance between two ends of two stripe structures in a same line. The width of the stripe opening 135 may be subsequently controlled by controlling the thickness of the polymer layer, so as that the distance between the two ends of the subsequently formed stripe structures in the same line may be correspondingly controlled. Thus, the width of the stripe opening 135 may be relatively large. Because the width of the stripe opening 135 may be relatively large, for example, it may be larger than the critical dimension, it may be unnecessary to use a thin and soft photoresist layer to form the second photoresist pattern 130. Further, because the width of the stripe opening 135 may be relatively large 135, it may be relatively easy to control the morphology of the side surfaces of the stripe opening 135.

In one embodiment, the width of the stripe opening 135 is greater than the critical dimension; and the distance between two ends of the subsequently formed stripe structures at a same line is smaller than the critical dimension. As used herein, the critical dimension may refer to the minimum size which may be obtained by the state-of-art photolithography process.

In one embodiment, the stripe opening 135 of the second photoresist pattern 130 may expose a portion of the hard mark pattern 120 having the first stripe; and the long side of the stripe opening 135 may be perpendicular to the long side of the hard mask pattern 120 having the first stripe. Such a configuration may cause the hard mask pattern 120 having the first stripe to be broken after subsequently etching the hard mask pattern 120 having the first stripe using the second photoresist pattern 130 as an etching mask. Thus, a plurality of relatively short hard patterns having a second stripe at a same line may be formed.

Returning to FIG. 17, after forming the second photoresist pattern 130, the second photoresist pattern 130 may be repaired (S104).

The side surface of the photoresist layer formed by the exposure and developing process may not be smooth. Further, with the continuously decreasing the critical dimension, it may be easy for the exposing light to diffract; and the photoresist may become softer and softer. Thus, it may be easy for the sidewalls of the photoresist layer formed by the exposure and developing process to have humps (scum) after the exposure and developing process. Therefore, the side surface of the subsequently formed stripe structures may be not even and/or smooth.

For example, referring to FIG. 4, the stripe structures may be the poly silicon gate 11 and/or the poly silicon gate 12. Because the opening between the poly silicon gate 11 and the poly silicon gate 12 of the adjacent MOS transistors may be substantially small, if there are some humps (scum) on the side surfaces of the stripe structures; it may be easy for the poly silicon gate 11 and the poly silicon gate 12 of the adjacent MOS transistors to bridge together. Thus, a short-circuit may happen between the first poly silicon gate 11 and the second poly silicon gate 12 of the adjacent MOS transistors; and the circuit having these transistors may fail.

Therefore, in one embodiment, the second photoresist pattern 130 may be repaired first. A process for repairing the second photoresist pattern may also be referred as a photoresist profile corrosion (or scum elimination) process. Various processes may be used to repair the second photoresist pattern 130. In one embodiment, a plasma treatment process is used to repair the second photoresist pattern 130. Specifically, reactive ions may be used to remove the humps on the side surfaces of the second photoresist pattern 130 to cause the side surfaces to be even and smooth; and to prevent poly silicon gates of adjacent MOS transistors from being connected. Further, a polymer layer may be subsequently formed on the surface of the second photoresist pattern 130, it may be easier to form the polymer layer on an even and smooth surface; and it may be easy to control the thickness of the polymer layer formed on the even and smooth surface. Therefore, the width of the stripe opening 135 may be easy to control; and it may be easy to control the distance between poly silicon gates of adjacent MOS transistors.

In one embodiment, the reaction gas of the plasma treatment process may include one or more of HBr, $O_2$, $H_2$, and Ar, etc. The flow of HBr may be in a range of approximately 20 sccm~500 sccm. The flow of $O_2$ may be in a range of approximately 5 sccm~50 sccm. The flow of $H_2$ may be in a range of approximately 20 sccm~200 sccm. The flow of Ar may be in a range of approximately 50 sccm~500 sccm. The temperature of the reaction chamber may be in a range of approximately 30° C.~60° C. The pressure of the reaction chamber may be in a range of approximately 3 mTorr~50 mTorr. The radio frequency power of the reaction chamber may be in a range of approximately 100 W~1000 W.

In certain other embodiments, the second photoresist pattern 130 may not be repaired. After forming the second photresist pattern 130, a polymer layer may be subsequently formed on the surfaces of the photoresist pattern 130 directly.

Figure 12:
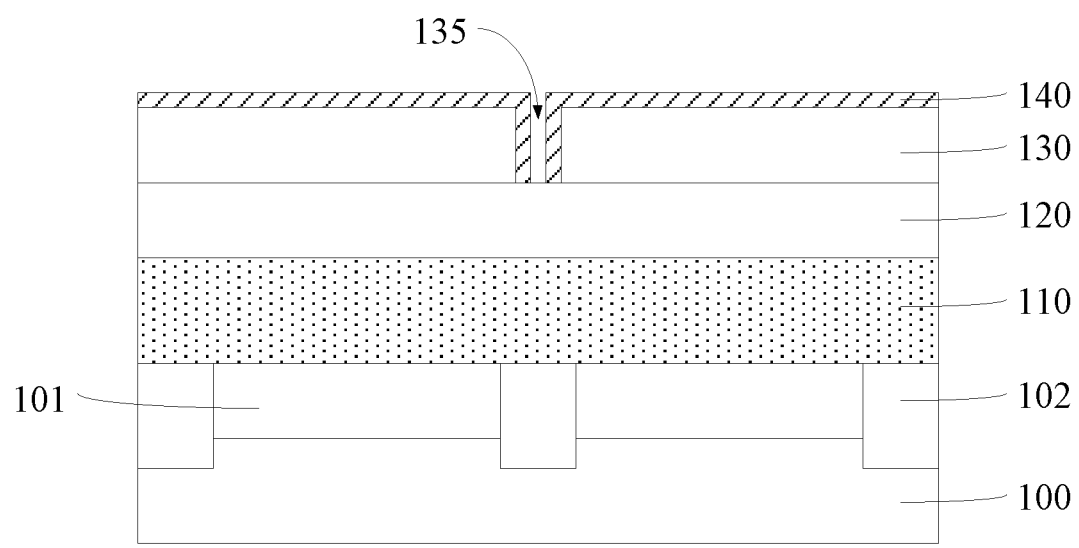

Returning to FIG. 17, after repairing the second photoresist pattern 130, a polymer layer may be formed on the surfaces of the second photoresist pattern 130 (S105). FIG. 12 illustrates a corresponding semiconductor structure.

As shown in FIG. 12, a polymer layer 140 is formed on the top surface and the side surfaces of the second photoresist pattern 120; and the width of the stripe opening 135 may be reduced.

Various processes may be used to form the polymer layer 140. In one embodiment, the polymer layer 140 is formed by a reactive plasma process. Specifically, the polymer layer 140 may be formed on the side surfaces and the top surface of the second photoresist pattern 130 by a reactive plasma process having one or more of $CH_3F$, $CH_2F_2$, HBr, and $CH_4$, etc., as a reaction gas. In one embodiment, the flow of HBr may be in a range of approximately 20 sccm~500 sccm. The flow of $CH_4$ may be in a range of approximately 2 sccm~20 sccm. The total flow of $CH_3F$ and $CH_2F_2$ may be in a range of approximately 20 sccm~500 sccm. The radio frequency power may be in a range of approximately 100 W~1000 W. The reaction temperature may be in a range of approximately 30° C.~60° C. The reaction pressure may be in a range of approximately 3 mTorr~50 mTorr.

By properly controlling the type of the reaction gas, the flow of the reaction gas, the reaction temperature, the reaction pressure, the radio frequency power and the reaction time, the thickness of the polymer layer 140 may be controlled; and the width of the stripe opening 135 may be controlled. Further, the width of the stripe opening 135 may be equal to the distance between two ends of adjacent subsequently formed stripe structures, i.e., head to head critical dimension (HtH CD), thus the process for forming the polymer layer 140 may be referred to a critical dimension control process. That is, the head to head critical dimension may be controlled.

In one embodiment, the thickness of the polymer layer 140 may be up to approximately 5 nm. In certain other embodiments, the thickness of the polymer layer 140 may be other appropriate values.

Because the polymer layer 140 may only be formed on the top surface and the side surfaces of the second photoresist pattern 130; and may not be formed on the surface of the semiconductor material, an extra process for subsequently removing the polymer layer 140 may be unnecessary; and it may only need one plasma ashing process to subsequently remove the second photoresist pattern 130 and the polymer layer 140 simultaneously. Thus, the entire semiconductor fabrication process may not be affected. Further, the hardness of the polymer layer 140 may be greater than the hardness of the second photoresist pattern 130, such that it may not be easy to deform the second photoresist pattern 130. Thus, it may aid to control the morphology of the side surfaces of the subsequently formed stripe structures.

Figure 13:
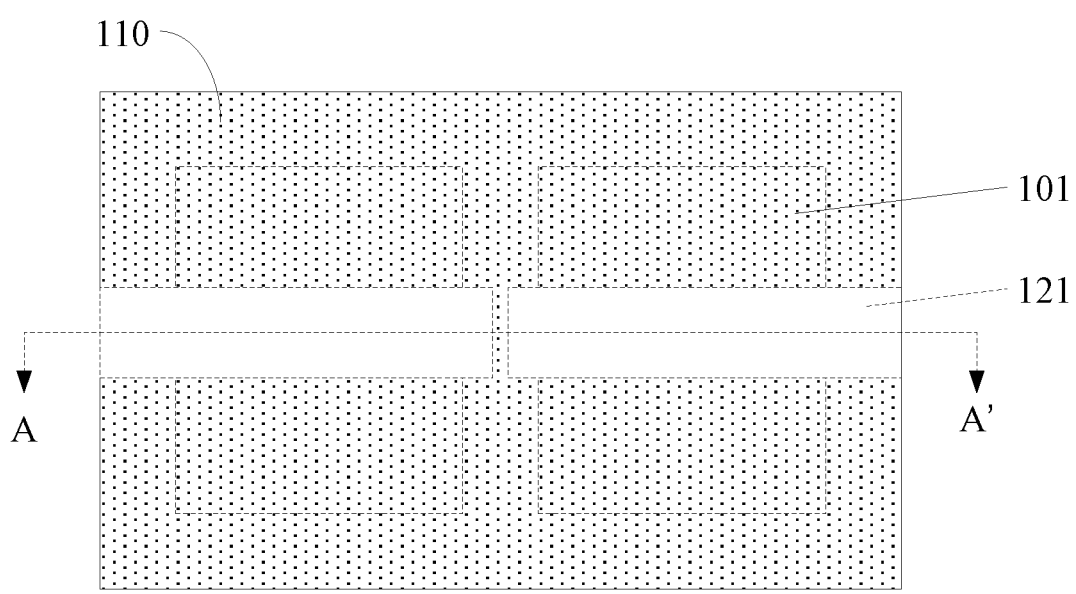
Figure 14:
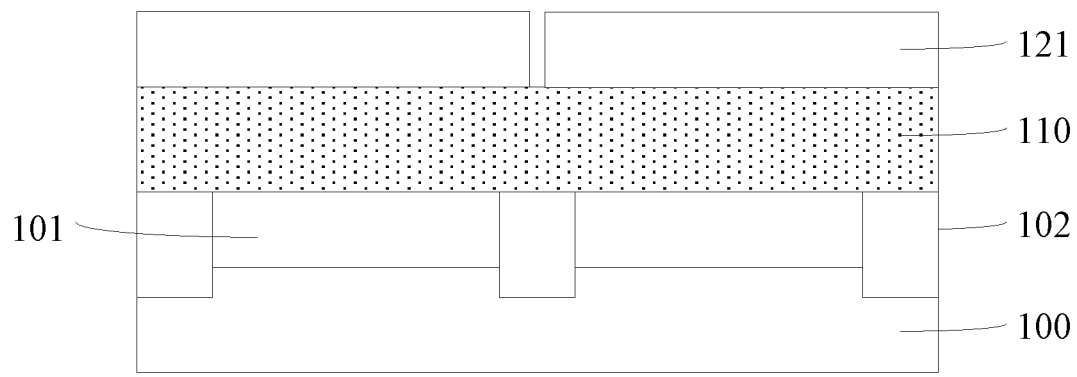

Returning to FIG. 17, after forming the polymer layer 140, a plurality of hard mask patterns having a second stripe may be formed (S106). FIGS. 13~14 illustrate a corresponding semiconductor structure; and FIG. 14 illustrates a cross-section view of the semiconductor structure shown in FIG. 13.

As shown in FIGS. 13~14, a plurality of hard mask patterns 121 having the second stripe at a same line are formed. The hard mask patterns 121 having the second stripe may be formed by etching the hard mask pattern 120 having the first stripe using the second photoresist pattern 130 having the polymer layer 140 as an etching mask. Thus, the length of the first stripe may be greater than the length of the second stripe.

Various processes may be used to etch the hard mask pattern 120 having the first stripe, such as a dry etching process, a wet etching process, or an ion beam etching process, etc. In one embodiment, a dry etching process is used to etching the hard mask pattern 120 having the first stripe to form the hard mask patterns 121 having the second stripe. In one embodiment, the side surface of the hard mask patterns 121 having the second stripe may be perpendicular to the surface of the to-be-etched layer 110.

Because the second photoresist pattern 130 having the polymer layer 140 may be used as an etching mask, the width of the stripe opening 135 of the second photoresist pattern 130 may be reduced; it may aid to reduce a distance between two ends of the adjacent subsequently formed stripe structures (head to head critical dimension). In one embodiment, the distance may be reduced to a size smaller than the critical dimension; and it may not be limited by the photolithography process.

For example, referring to FIG. 5, in the existing fabrication method, one end of the first poly silicon gate 11 and/or the second poly silicon gate 12 may not connect with the shallow trench isolation structure 102 because of the overlay shift of the photolithography process. However, in the disclosed method, the polymer layer 140 is formed on the side surfaces of the second photoresist pattern 130, even there may be an overlay shift for the photolithography process, the hard mask patterns 121 having the second stripe formed by etching the hard mask pattern 120 having the first stripe using the second photoresist pattern 130 having the polymer layer 140 as an etching mask may still be on the top of the shallow trench isolation structures 102, thus both ends of the subsequently formed stripe structures may be still on the surface of the shallow trench isolation structures 102; and the MOS transistor may not fail.

Figure 18:
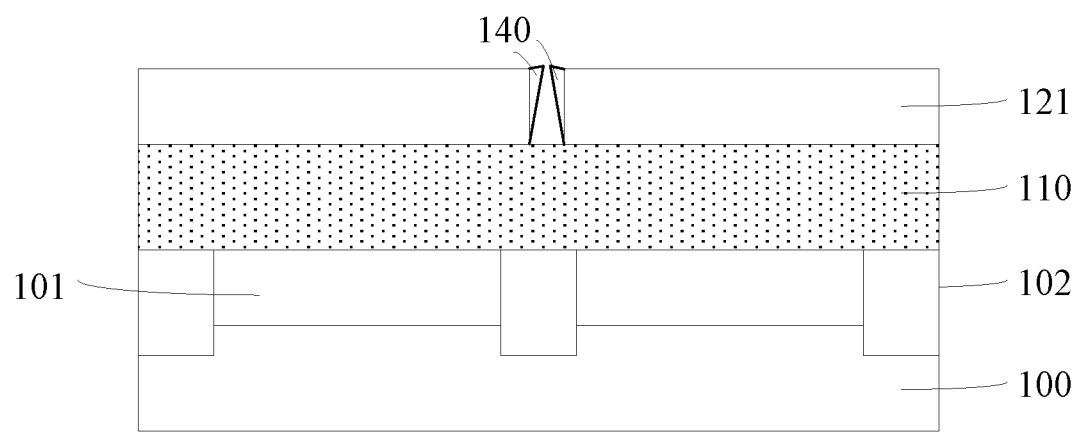
FIG. 18 illustrates an exemplary semiconductor structure corresponding to a certain stage when forming second stripes made of a hard mask pattern consistent with the disclosed embodiments.

In certain other embodiments, etching gases containing a significantly high carbon concentration, such as $CH_3F$, $CH_2F_2$ or $CH_4$, may be used to etch the hard mask pattern 120 having the first stripe (also referred to as "the first stripe made of the hard mask pattern"). During the process for forming the hard mask patterns 121 having the second stripe using the etching gas containing a significantly high carbon concentration, the polymer layer 140 may be formed on the side surfaces of the hard mask patterns 121 having the second stripe (also referred to as "the second stripes made of the hard mask pattern); and the side surfaces of the broken portions of adjacent hard mask patterns 121 having the second stripe may become inclining, as shown in FIG. 18. That is, an inverse trapezoid opening may be formed. Therefore, the distance between two ends of the subsequently formed stripe structures may be smaller after subsequently etching the to-be-etched layer 110 using the hard mask patterns 121 having the second stripe as an etching mask.

Returning to FIG. 17, after forming the hard mask patterns 121 having the second stripe, stripe structures 115 may be formed (S107). FIGS. 15~16 illustrate a corresponding semiconductor structure; and FIG. 16 illustrates a cross-section view of the semiconductor structures illustrated in FIG. 15 along the AA' direction.

As shown in FIGS. 15~16, stripe structures 115 are formed. The stripe structures 115 may be formed by etching the to-be-etched layer 110 using the hard mask patterns 121 having the second stripe as an etching mask until the substrate 100 is exposed.

Various processes may be used to etch the to-be-etched layer 110, such as a dry etching process, a wet etching process, or an ion beam etching process, etc. In one embodiment, a dry etching process is used to etch the to-be-etched layer 110 to form the stripe structures 115.

Further, after forming the stripe structures 115, the hard mask patterns 121 having the second stripe and the second photoresist pattern 130 with the polymer layer 140 may be removed. Various processes may be used to remove the second photoresist pattern 130, such as a dry etching process, a wet etching process, or plasma ashing process, etc. In one embodiment, the second photoresist layer 130 with the polymer layer 140 is removed by a plasma ashing process. In certain other embodiments, the second photoresist layer 130 is removed by a dry etching process, or a wet etching process.

Various processes may be used to remove the hard mask patterns 121 having the second stripe, such as a dry etching process, or a wet etching process, etc. In one embodiment, the hard mask patterns 121 having the second stripe are removed by a wet etching process.

In one embodiment, the stripe structures 115 are poly silicon gates. In certain other embodiments, the stripe structures 115 may be metal interconnect lines resistors, or metal gate structures formed by a gate-last process, etc.

Thus, a semiconductor structure having stripe structures may be formed by the above disclosed processes and methods; and a corresponding semiconductor structure is illustrated in FIGS. 15~16. The semiconductor structure having stripe structures includes a substrate 100; and a plurality of shallow trench isolation structures 102. The semiconductor structure having stripe structures also includes a plurality of active regions 101 on the substrate 100 isolated by the shallow trench isolation structures 102. Further, the semiconductor structure includes a plurality of stripe structures 115. The detailed structures and intermediate structures are described above with respect to the fabrication processes The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure having stripe structures, comprising:
    a substrate;
    a plurality of isolation structures formed in a surface of the substrate;
    a plurality of active regions isolated by the isolation structures formed on the surface of the substrate;
    a to-be-etched layer formed on top surfaces of the isolation structures and active regions;
    a first stripe made of a hard mask pattern formed on the to-be-etched layer, and a portion of the to-be-etched layer being exposed by the first stripe;
    a photoresist pattern formed on the exposed to-be-etched layer and directly on the first stripe, the photoresist pattern including a stripe opening formed on the first stripe and perpendicular in length directions with the first stripe, and the stripe opening exposing a portion of the hard mask pattern, wherein a projection of the exposed portion of the hard mask pattern on a top surface of the plurality of isolation structures is within the top surface of the plurality of isolation structures and the exposed portion of the hard mask pattern is within a cross area between the first stripe and the photoresist pattern; and
    a polymer layer formed on a top surface and side surfaces of the photoresist pattern and to form a reduced opening in the stripe opening, wherein
        a hardness of the polymer layer is greater than a hardness of the photoresist pattern;
        a width of the stripe opening located on an isolation structure of the plurality of isolation structures being greater than a critical dimension of a photolithography process and a width of the reduced opening located on an isolation structure of the plurality of isolation structures being smaller than the critical dimension, and
        the width of the stripe opening and the width of the reduced opening are both smaller than a width of the isolation structure.

2. The semiconductor structure having stripe structures according to claim 1, wherein:
    the stripe structures are poly silicon gates, metal gates, resistors, or metal interconnect lines.

3. The semiconductor structure having stripe structures according to claim 1, wherein:
    the photoresist pattern is repaired to have smooth and even side surfaces before forming the polymer layer.

4. The semiconductor structure having stripe structures according to claim 3, wherein:
    the photoresist pattern is repaired by a plasma treatment process such that side surfaces of the photoresist pattern are smooth and even.

5. The semiconductor structure having stripe structures according to claim 1, wherein:
    the hard mask patterns are etched by a reaction gas having a significantly high carbon concentration, including $CH_3F$, $CH_2F_2$ or $CH_4$.

6. The semiconductor structure having stripe structures according to claim 1, wherein:
    the polymer layer is formed by a plasma reaction process with a reaction gas including at least one of $CH_3F$, $CH_2F_2$, HBr and Ar.

7. The semiconductor structure having stripe structures according to claim 1, wherein:
    a thickness the polymer layer is up to approximately 5 nm.

8. The semiconductor structure having stripe structures according to claim 1, wherein the first strip made of the hard mask pattern is etched by a carbon-containing etching gas including $CH_3F$, $CH_2F_2$ or $CH_4$ to break the first stripe into a plurality of second stripes, and to simultaneously form the polymer layer on side surfaces of broken portions of the plurality of second stripes made of the hard mask pattern,
    wherein the broken portions provide the side surfaces of the plurality of second stripes with inclining sidewalls.

9. The semiconductor structure having stripe structures according to claim 8, wherein:
    the inclining sidewalls of two adjacent second stripes form a triploid; and
    by using the second stripes with the inclining sidewalls as an etch mask to form the stripe structures from the to-be-etched layer, a distance between two ends of the adjacent stripe structures becomes smaller compared with the second stripes without inclining sidewalls.

10. The semiconductor structure having stripe structures according to claim 1, wherein:
    the hard mask pattern is made of one or more of silicon oxide, silicon nitride, silicon oxynitride and metal layer.

11. The semiconductor structure having stripe structures according to claim 1, wherein:
    the first stripe made of the hard mask pattern is formed directly on the to-be-etched layer.

12. The semiconductor structure having stripe structures according to claim 1, wherein:
    the stripe of the hard mask pattern is one or more rectangular silicon nitride layers.

* * * * *